(12) United States Patent
Fischer et al.

(10) Patent No.: US 10,488,567 B2
(45) Date of Patent: Nov. 26, 2019

(54) FACETED MIRROR FOR EUV PROJECTION LITHOGRAPHY AND ILLUMINATION OPTICAL UNIT WITH SAME

(71) Applicant: Carl Zeiss SMT GmbH, Oberkochen (DE)

(72) Inventors: Thomas Fischer, Aalen (DE); Sarina Wunderlich, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 124 days.

(21) Appl. No.: 15/801,693

(22) Filed: Nov. 2, 2017

(65) Prior Publication Data

US 2018/0074236 A1 Mar. 15, 2018

Related U.S. Application Data

(63) Continuation of application No. PCT/EP2016/059219, filed on Apr. 26, 2016.

(30) Foreign Application Priority Data

May 7, 2015 (DE) .......... 10 2015 208 514

(51) Int. Cl.
*G03F 7/20* (2006.01)
*G02B 5/08* (2006.01)
(Continued)

(52) U.S. Cl.
CPC .......... *G02B 5/0891* (2013.01); *G02B 5/09* (2013.01); *G02B 5/10* (2013.01); *G02B 26/0833* (2013.01);
(Continued)

(58) Field of Classification Search
CPC .......... G02B 5/0891; G02B 5/09; G02B 5/10; G02B 26/0833; G03F 7/70075; G03F 7/70091; G03F 7/70116; G03F 7/70558
(Continued)

(56) References Cited

U.S. PATENT DOCUMENTS 6,438,199 B1   8/2002   Schultz et al.
6,507,440 B1   1/2003   Schultz
(Continued)

FOREIGN PATENT DOCUMENTS

DE        19 931 848 A1   1/2001
DE   10 2008 040 938 A1   2/2009
(Continued)

OTHER PUBLICATIONS

German Examination Report, with translation thereof, for corresponding Appl No. 10 2015 208 514.7, dated Mar. 24, 2016.

*Primary Examiner* — Colin W Kreutzer
(74) *Attorney, Agent, or Firm* — Fish & Richardson P.C.

(57) ABSTRACT

A facet mirror for EUV projection lithography has a plurality of facets for reflecting EUV illumination light. At least some of the facets are in the form of alignment facets and have a reflection surface, the edge contour of which is aligned along two alignment coordinates of an overall facet arrangement. The reflection surface of at least one of the alignment facets has a surface shape that exhibits different curvatures along two axes of curvature. The axes of curvature are tilted about a finite axis tilt angle relative to the alignment coordinates of the overall facet arrangement. The result is a facet mirror with increased EUV throughput, particularly for prolonged operation of a projection exposure apparatus that is equipped therewith.

20 Claims, 6 Drawing Sheets

(51) Int. Cl.
*G02B 5/10* (2006.01)
*G02B 5/09* (2006.01)
*G02B 26/08* (2006.01)

(52) U.S. Cl.
CPC ...... *G03F 7/70075* (2013.01); *G03F 7/70091* (2013.01); *G03F 7/70116* (2013.01); *G03F 7/70558* (2013.01)

(58) Field of Classification Search
USPC .............................. 355/67, 71; 359/359, 627
See application file for complete search history.

(56) References Cited

U.S. PATENT DOCUMENTS

| | | |
|---|---|---|
| 6,658,084 B2 | 12/2003 | Singer |
| 6,859,328 B2 | 2/2005 | Schultz et al. |
| 6,859,515 B2 | 2/2005 | Schultz et al. |
| 2011/0001947 A1 | 1/2011 | Dinger et al. |
| 2015/0192860 A1 | 7/2015 | Fischer |

FOREIGN PATENT DOCUMENTS

| | | |
|---|---|---|
| DE | 10 2008 009 600 A1 | 8/2009 |
| DE | 10 2011 076 145 A1 | 11/2012 |
| DE | 10 2012 220 597 | 5/2014 |
| JP | 2012-244184 A | 12/2012 |
| WO | WO 2008/149178 A1 | 12/2008 |
| WO | WO 2009/100856 A1 | 8/2009 |
| WO | WO 2009/132756 A1 | 11/2009 |

FACETED MIRROR FOR EUV PROJECTION LITHOGRAPHY AND ILLUMINATION OPTICAL UNIT WITH SAME

CROSS-REFERENCE TO RELATED APPLICATIONS

The present application is a continuation of, and claims benefit under 35 USC 120 to, international application PCT/EP2016/059219, filed Apr. 26, 2016, which claims benefit under 35 USC 119 of German Application No. 10 2015 208 514.7, filed May 7, 2015. The entire disclosure of these applications are incorporated by reference herein.

FIELD

The disclosure relates to a facet mirror for EUV projection lithography. The disclosure furthermore relates to an illumination optical unit having such a facet mirror, to an illumination system and to an optical system having such an illumination optical unit, to a projection exposure apparatus having such an optical system, to a method for producing a microstructured or nanostructured component by way of such a projection exposure apparatus, and to a microstructured or nanostructured component that is produced by way of such a method.

BACKGROUND

An illumination optical unit of the type mentioned in the introduction is known from US 2011/0001947 A1, WO 2009/132 756 A1, WO 2009/100 856 A1 and from U.S. Pat. No. 6,438,199 B1 and U.S. Pat. No. 6,658,084 B2. A field facet mirror is known from DE 19 931 848 A1, from WO 2008/149 178 A1, from DE 10 2011 076 145 A1 and from U.S. Pat. No. 6,859,328.

SUMMARY

The disclosure seeks to develop a facet mirror for EUV projection lithography with increased EUV throughput thereof, particularly for prolonged operation of a projection exposure apparatus that is equipped therewith.

The disclosure provides a facet mirror for EUV projection lithography. The facet mirror includes a plurality of facets for reflecting EUV illumination light. At least some of the facets are in the form of alignment facets and have a reflection surface, the edge contour of which is aligned along two alignment coordinates of an overall facet arrangement. The reflection surface of at least one of the alignment facets has a surface shape that exhibits different curvatures along two axes of curvature. The axes of curvature are tilted about a finite axis tilt angle with respect to the alignment coordinates of the overall facet arrangement. The specified surface shape will also be referred to below as a "toric surface." Radii of curvature of such a "toric surface" do not need to be so different as to form a torus overall, i.e. do not need to differ by more than a factor of 2.

In accordance with the disclosure, it has been found that a tilt of axes of curvature, which define the curvatures of a surface shape of the facet reflection surface, with respect to alignment coordinates of these facets offers an additional degree of freedom which improves a guiding of illumination-light partial beams by illumination channels that are defined by the respective field facets for optimization purposes. In particular it is possible for a field-dependent centroid profile of illumination-light subbeams, which originate from different points on the facet, on facets of a downstream facet mirror to be influenced selectively such that the illumination-light subbeam extends advantageously and, if possible, field-independently compactly where it is guided by subsequent components of the illumination optical unit and in particular by the facets of the downstream facet mirror. A tilt of the axes of curvature with respect to the alignment coordinates x, y of the overall facet arrangement can take place about a z-coordinate of the overall facet arrangement. Both axes of curvature of the toric surface can be tilted about the same axis. The radii of curvature of the toric surface about the two axes of curvature differ. The radii of curvature can lie in the range between 200 mm and 2000 mm, in particular in the range between 500 mm and 1500 mm or between 800 mm and 1200 mm and in particular in the range around 1000 mm. An eccentricity, that is to say a difference between the two radii of curvature, can lie in the range between 10 mm and 100 mm and in particular in the range between 20 mm and 60 mm, for example in the range around 40 mm. The respectively smaller radius of curvature of the toric reflection surface of the respective alignment facet is in any case finite. If the tilted axes of curvature of the reflection surface of the at least one alignment facet are main axes of curvature of the reflection surface, which are always orthogonal with respect to one another, it suffices to specify a single axis tilt angle of the axes of curvature relative to the alignment coordinates to specify a reflection surface tilt.

A toric surface within the meaning of this application is understood to mean a surface shape that has different curvatures along two axes of curvature, which can be two mutually perpendicular main axes of curvature. The associated curvatures can be spherical or aspherical and can be described, for example, by way of an expansion of mutually orthogonal base functions. Even an ellipsoid surface having different curvatures along at least two axes of curvature represents a toric surface within the present meaning.

All facets of the facet mirror can be configured as such alignment facets with axes of curvature that are tilted with respect to the alignment coordinates and in each case define the toric surfaces.

The reflection surface of at least two of the alignment facets have surface shapes that exhibit different curvatures along two axes of curvature, wherein the axis tilt angles of these alignment facets differ. In such a configuration, a tilt of the axes of curvature of the toric reflection surface of the respective facet relative to the alignment coordinates of the overall facet arrangement is specified individually for at least two of the alignment facets. This results in a further degree of freedom for optimizing beam guidance of the EUV illumination-light partial beams over the toric facet reflection surfaces.

The axis tilt angle can be at least one degree. Such an axis tilt angle has proven particularly suitable for optimization. The axis tilt angle can be at least 2 degrees, can be at least 3 degrees, can be at least 4 degrees, can be at least 5 degrees, and can be for example 6 degrees. An even greater axis tilt angle is also possible, for example an axis tilt angle of 10 degrees, of 15 degrees, or an even greater axis tilt angle.

A greater radius of curvature of the reflection surface can be infinite. Such an infinite greater radius of curvature results in a toric reflection surface in the form of a cylindrical lens. In this case, there is ultimately exactly one axis of curvature that defines the shape of the cylindrical lens, because a direction of the other axis of curvature is not important on account of the infinite curvature. Even in such a special design case of the at least one alignment facet in the form of a cylindrical lens, there is a corresponding tilt of the cylinder axis of curvature with respect to the alignment coordinate of the overall facet arrangement.

Both radii of curvature of the reflection surface can be finite. Two such finite radii of curvature result in a reflection surface that is curved via two axes of curvature.

The disclosure provides an illumination optical unit for illuminating an object field, in which an object that is to be imaged with EUV illumination light is arrangeable, with illumination light. The illumination optical unit can have a facet mirror as described herein. The advantages of such an illumination optical unit correspond to those that have already been explained above with reference to the facet mirror.

The facet mirror having the at least one alignment facet can be a field facet mirror of the illumination optical unit.

Some or all of the field facets and/or of the pupil facets can for their part be composed of a plurality of small individual mirrors. In particular, the field facet mirror and/or the pupil facet mirror can be configured in the form of a MEMS (microelectromechanical mirror) array, wherein each of the field facets or each of the pupil facets can then be composed of a plurality of small MEMS mirrors. One example of such a MEMS construction is provided by WO 2009/100 856 A1.

The transfer optical unit that is arranged downstream of the field facets in the respective illumination channel can be formed exclusively by a pupil facet that is arranged downstream in each case within an illumination channel. Alternatively, the transfer optical unit can also have further components, in particular further mirrors, which are arranged downstream e.g. of a pupil facet of a respective illumination channel and upstream of the object field.

An illumination system can include an illumination optical unit having a facet mirror described herein, and a light source for generating the illumination light. An optical system can include an illumination optical unit having a facet mirror described herein, and a projection optical unit for imaging the object field into an image field. A projection exposure apparatus can have such an optical system and a light source for generating the illumination light. A method can include using such a projection exposure apparatus to produce a microstructured or nanostructured component. The advantages of such an illumination system, optical system, projection exposure apparatus and method correspond to those that have already been explained above with reference to the illumination optical unit in accordance with the disclosure.

A component produced by such a method can be produced with an extremely high structure resolution. In this way, for example a semiconductor chip with an extremely high integration or storage density can be produced.

BRIEF DESCRIPTION OF THE DRAWINGS

Exemplary embodiments of the disclosure will be described in more detail below with reference to the drawing, in which.

DETAILED DESCRIPTION

Figure 1:
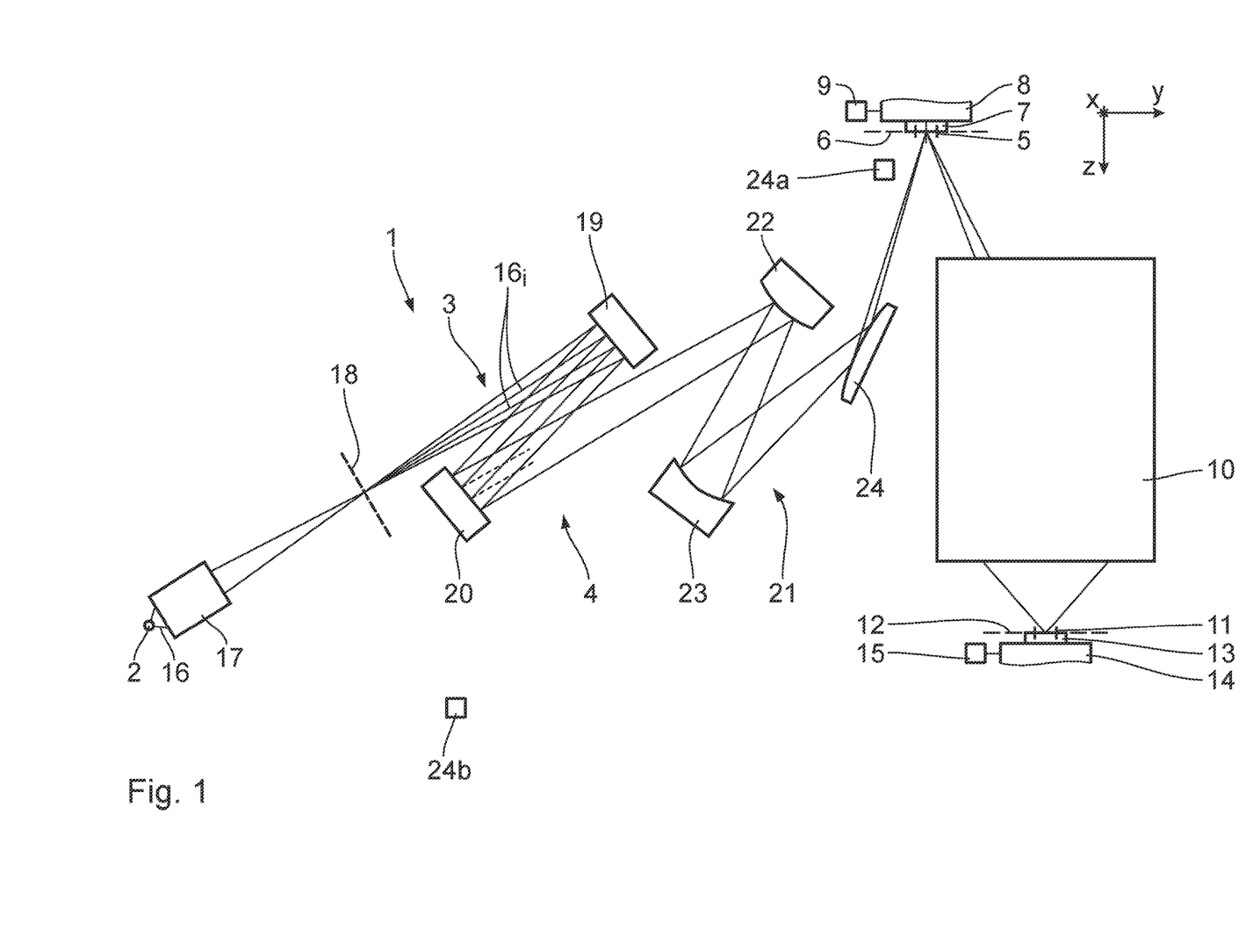
FIG. 1 schematically illustrates a meridional section through a projection exposure apparatus for EUV projection lithography.

FIG. 1 schematically shows a meridional section of a microlithographic projection exposure apparatus 1. Part of the projection exposure apparatus 1 is a light or radiation source 2. An illumination system 3 of the projection exposure apparatus 1 has an illumination optical unit 4 for exposing an illumination field in an object plane 6 that coincides with an object field 5. The illumination field can also be larger than the object field 5. In this case, an object in the form of a reticle 7, which is arranged in the object field 5 and held by an object or reticle holder 8, is exposed. The reticle 7 is also referred to as a lithography mask. The object holder 8 is displaceable along an object displacement direction by way of an object displacement drive 9. A projection optical unit 10, which is illustrated highly schematically, serves for imaging the object field 5 into an image field 11 in an image plane 12. A structure on the reticle 7 is imaged onto a light-sensitive layer of a wafer 13 that is arranged in the region of the image field 11 in the image plane 12. The wafer 13 is held by a wafer holder 14. The wafer holder 14 is displaceable parallel to the object displacement direction in synchronization with the object holder 8 by way of a wafer displacement drive 15.

The radiation source 2 is an EUV radiation source with an emitted used radiation in the range between 5 nm and 30 nm. This radiation source can be a plasma source, for example a GDPP source (gas-discharge-produced plasma) or an LPP source (laser-produced plasma). A radiation source based on a synchrotron or on a free electron laser (FEL) is also usable as the radiation source 2. A person skilled in the art can find information relating to such a radiation source in U.S. Pat. No. 6,859,515 B2, for example. EUV radiation 16, emerging from the radiation source 2, in particular the used illumination light that illuminates the object field 5, is focused by a collector 17. A corresponding collector is known from EP 1 225 481 A. Downstream of the collector 17, the EUV radiation 16 propagates through an intermediate focal plane 18 before being incident on a field facet mirror 19.

The field facet mirror 19 is a first facet mirror of the illumination optical unit 4. The field facet mirror 19 has a plurality of reflective field facets, which are not shown in FIG. 1. The field facet mirror 19 is arranged in a field plane of the illumination optical unit 4 which is optically conjugate to the object plane 6.

The EUV radiation 16 will also be referred to below as illumination light or as imaging light.

Downstream of the field facet mirror 19, the EUV radiation 16 is reflected by a pupil facet mirror 20. The pupil facet mirror 20 is a second facet mirror of the illumination optical unit 4. The pupil facet mirror 20 is arranged in a pupil plane of the illumination optical unit 4 which is optically conjugate to the intermediate focal plane 18 and to a pupil plane of the illumination optical unit 4 and of the projection optical unit 10 or coincides with this pupil plane. The pupil facet mirror 20 has a plurality of reflective pupil facets, which are not shown in FIG. 1. The pupil facets of the pupil facet mirror 20 and of a subsequent imaging optical assembly in the form of a transfer optical unit 21 having mirrors 22, 23 and 24, which are designated in the order of the beam path, are used to image the field facets of the field facet mirror 19 into the object field 5 such that they overlay one another. The last mirror 24 of the transfer optical unit 21 is a grazing incidence mirror. Depending on the configuration of the illumination optical unit 4, it is also possible to dispense with the transfer optical unit 21 entirely or in part.

Illumination light 16, which is guided for example in the object plane 6 toward greater absolute x-values than the x-dimension of the object field 5, can be guided, using a corresponding optical unit (not illustrated), to a plurality of energy or dose sensors, one dose sensor 24a of which is schematically illustrated in FIG. 1. The dose sensor 24a is in signal connection with a central control device 24b in a manner that is not illustrated. The dose sensor 24a generates an input signal for controlling the light source 2 and/or the object displacement drive 9 and/or the wafer displacement drive 15. It is hereby possible to achieve dose adaptation of an exposure of the wafer 13 in the image field 11 first by adapting an output of the light source 2 and/or secondly by adapting a scanning speed.

The control device 24b is in signal connection with tilt actuators for the field facets 25 of the field facet mirror 19, among others.

To facilitate the description of positional relationships, a Cartesian xyz coordinate system is shown in FIG. 1 in the form of a global coordinate system for describing the positional relationships of components of the projection exposure apparatus 1 between the object plane 6 and the image plane 12. The x-axis in FIG. 1 extends perpendicular with respect to and into the drawing plane. The y-axis in FIG. 1 extends to the right and parallel with respect to the displacement direction of the object holder 8 and of the wafer holder 14. The z-axis in FIG. 1 extends downward, i.e. perpendicular to the object plane 6 and to the image plane 12.

The x-dimension over the object field 5 or the image field 11 is also referred to as the field height. The object displacement direction extends parallel with respect to the y-axis.

Local Cartesian xyz coordinate systems are shown in the other figures. The x-axes of the local coordinate systems extend parallel with respect to the x-axis of the global coordinate system in accordance with FIG. 1. The xy-planes of the local coordinate systems represent arrangement planes of the components which are respectively illustrated in the figure. The y- and z-axes of the local coordinate systems are correspondingly tilted by a specific angle about the respective x-axis.

Figure 2:
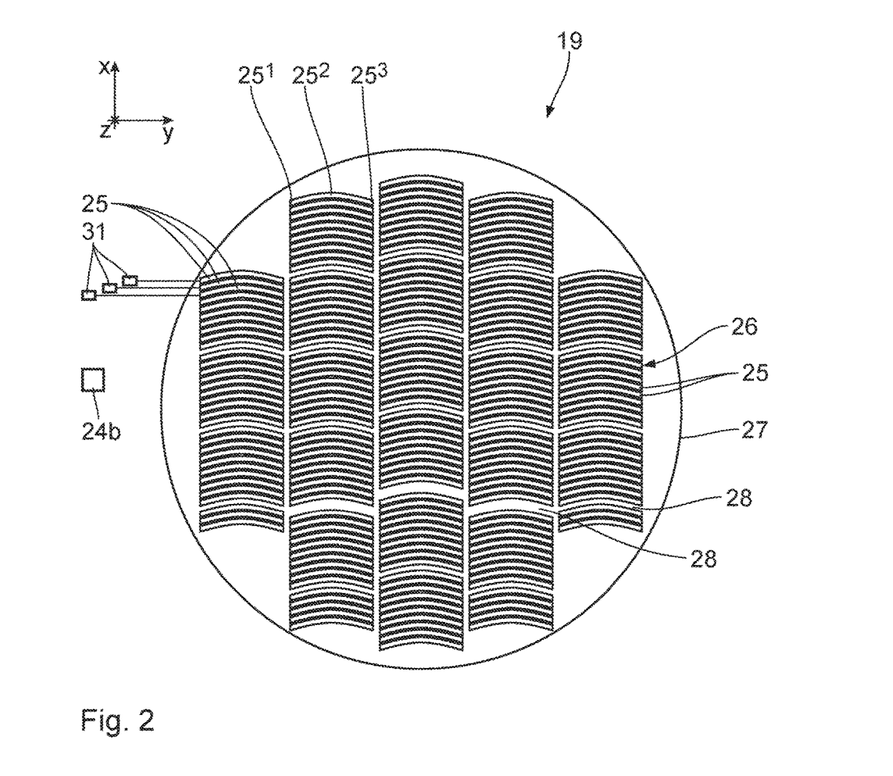
FIGS. 2 and 3 illustrate arrangement variants of field facet mirrors, which can be configured with monolithic field facets, but can also have field facets that are in each case composed of a plurality of individual mirrors.
Figure 3:
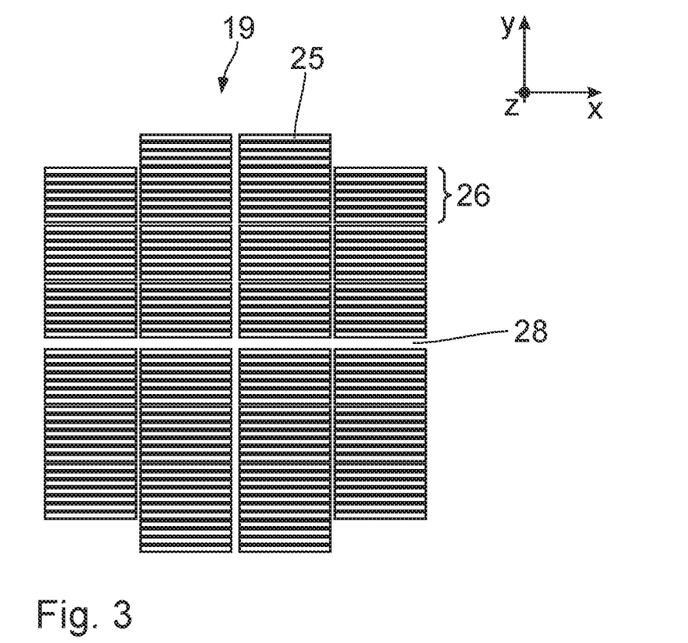

FIGS. 2 and 3 show examples of different facet arrangements for the field facet mirror 19. Each of the field facets 25 illustrated there can be constructed as an individual-mirror group from a plurality of individual mirrors, as is known for example from WO 2009/100 856 A1. Each of the individual-mirror groups then has the function of a facet of a field facet mirror, as is disclosed for example in U.S. Pat. No. 6,438,199 B1 or U.S. Pat. No. 6,658,084 B2.

The field facets 25 can be configured to be tiltable between a plurality of tilt positions by way of an actuator.

The field facet mirror 19 in accordance with FIG. 2 has a multiplicity of field facets 25 of curved configuration. These are arranged group-wise in field facet blocks 26 on a field facet carrier 27. Overall, the field facet mirror 19 in accordance with FIG. 2 has twenty-six field facet blocks 26, which are formed by grouping together 3, 5 or 10 of the field facets 25.

Intermediate spaces 28 are located between the field facet blocks 26.

The field facet mirror 19 in accordance with FIG. 3 has rectangular field facets 25, which in turn are arranged group-wise in field facet blocks 26, between which intermediate spaces 28 are located.

Figure 4:
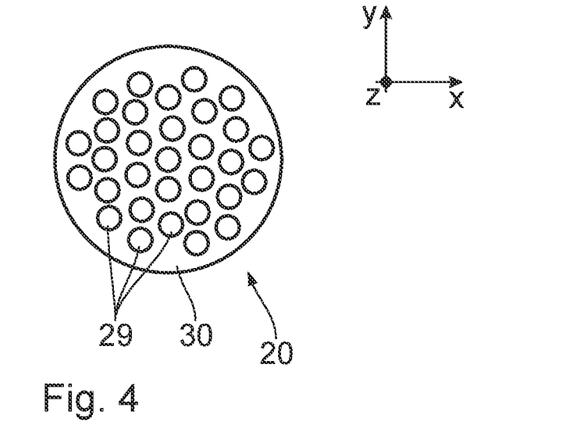
FIG. 4 schematically illustrates a plan view of a pupil facet mirror, which, together with the field facet mirror, is part of an illumination optical unit of the projection exposure apparatus.

FIG. 4 schematically shows a plan view of the pupil facet mirror 20. Pupil facets 29 of the pupil facet mirror 20 are arranged in the region of an illumination pupil of the illumination optical unit 4. The number of the pupil facets 29 in reality is greater than illustrated in FIG. 4. The number of the pupil facets 29 can in reality be greater than the number of the field facets 25 and can be many times the number of the field facets 25. The pupil facets 29 are arranged on a pupil facet carrier of the pupil facet mirror 20. A distribution of pupil facets 29, on which the illumination light 16 impinges by way of the field facets 25, within the illumination pupil specifies an actual illumination angle distribution in the object field 5.

Each of the field facets 25 serves for transferring a portion of the illumination light 16, i.e. of an illumination-light partial beam $16_i$, from the light source 2 to one of the pupil facets 29.

The description of illumination-light partial beams $16_i$ below is based on the assumption that the associated field facet 25 is in each case lit in maximum fashion, i.e. over its entire reflection surface. In this case, an edge contour of the illumination-light partial beam $16_i$ coincides with an edge contour of the illumination channel, which is why the illumination channels will also be designated $16_i$ below. The respective illumination channel $16_i$ represents one possible optical path of an illumination-light partial beam $16_i$, which lights the associated field facet 25 in maximum fashion, over the further components of the illumination optical unit 4.

The transfer optical unit 21 has in each case one of the pupil facets 29 for each of the illumination channels $16_i$ for transferring the illumination-light partial beam $16_i$ from the field facet 25 to the object field 5.

In each case one illumination-light partial beam $16_i$, of which FIG. 1 schematically illustrates two illumination-light partial beams $16_i$ (i=1, . . . , N; N: number of the field facets), is guided between the light source 2 and the object field 5 via exactly one of the field facets 25 and via exactly one of the pupil facets 29 via in each case one illumination channel.

Figure 5:
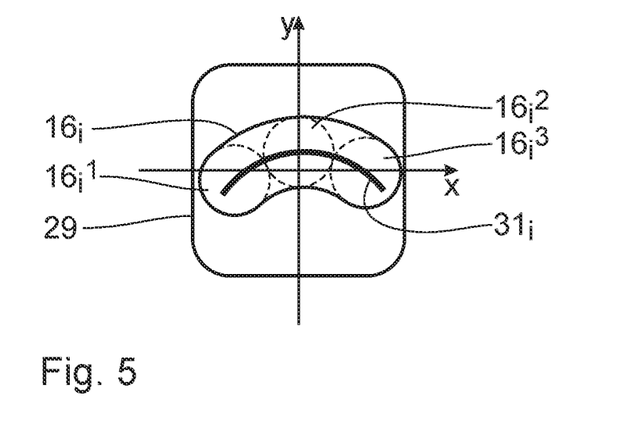
FIG. 5 illustrates a variant of a pupil facet, which can be used in the pupil facet mirror in accordance with FIG. 4, wherein shown on the pupil facet is an edge contour of an illumination-light partial beam which impinges on the pupil facet via exactly one of the field facets and a specified illumination channel, wherein, in addition to the edge contour of the illumination-light partial beam, a field-dependent centroid profile of illumination-light subbeams is also illustrated which originate from different points on the respective field facet during the imaging of the light source.

FIG. 5 shows one of the pupil facets 29 that can be used in the pupil facet mirror 20. The pupil facet 29 in accordance with FIG. 5 does not have a circular edge contour, as illustrated in FIG. 4, but an approximately square edge contour with rounded corners. Such an edge contour, which can also be square or rectangular without rounded corners, makes it possible for the pupil facet carrier 30 to be populated relatively densely with the pupil facets 29.

The illumination-light partial beam $16_i$ impinges on the pupil facet 29 in accordance with FIG. 5 by way of an arch-shaped field facet 25 of the field facet mirror 19 in accordance with FIG. 2.

In the arrangement illustrated in FIG. 5, an entire cross section of the illumination-light partial beam $16_i$ is located on the pupil facet 29, with the result that the illumination-light partial beam $16_i$ is not cut off at the edges by the edge of the pupil facet 29. An edge contour of the cross section of the illumination-light partial beam $16_i$ on the pupil facet 29 has an approximately arch-shaped, bean-shaped or kidney-shaped form and can be understood as a convolution of the arch-shaped field facets 25 in accordance with FIG. 2 with a round source area of the light source 2. This convolution is produced owing to the fact that an image of the light source 2 is formed for different sections on the associated field facet 25, i.e. in a field-dependent manner, at different image sites and in addition generally at an image site that is located along the illumination channel $16_i$ spaced apart from the pupil facet 29, i.e. upstream or downstream of the pupil facet 29 in the beam path.

The arch-shaped edge contour of the illumination-light partial beam $16_i$ on the pupil facet 29 represents a light spot of the illumination-light partial beam $16_i$.

The dashes in the edge contour of the illumination-light partial beam $16_i$ on the pupil facet 29 show three subbeams $16_i^1$, $16_i^2$ and $16_i^3$. The illumination-light partial beam $16_i$ is made up of a multiplicity of such subbeams $16_i^j$. The illumination-light partial beam $16_i$ on the respective pupil facet 29 can, if the optical parameters of the illumination are known, be calculated, for example by way of an optical design program, and is in this context also referred to as a "point spread function."

The illumination light 16 of these subbeams $16_i^1$ to $16_i^3$ originates from a left-hand edge point $25^1$, from a central point $25^2$ and from a right-hand edge point $25^3$ of the associated field facet 25. By way of example, FIG. 2 shows these points of origin $25^1$ to $25^3$ on one of the field facets 25.

A field-dependent centroid profile $31_i$ of all subbeams $16_i^j$ originating from the associated field facet 25 represents a core of an edge contour of the respective illumination-light partial beam $16_i$ on each pupil facet 29. This centroid profile $31_i$ is distinct for each illumination channel $16_i$ and depends, among others, on the geometric profile of the illumination channel $16_i$ between the light source 2 and the respective pupil facet 29 via the associated field facet 25.

FIG. 5 here shows an idealized field-dependent centroid profile $31_i$.

To influence an extent of an edge contour of the illumination-light partial beam $13_i$ or an xy-extent of the respective field-dependent centroid profile $31_i$, reflection surfaces 32 of the field facets 25 are in the form of toric surfaces. This will be explained below with reference to FIGS. 6 to 8 using the example of rectangular field facets 25 in the manner of those in FIG. 3.

A rectangular edge contour 33 of the field facets 25 is aligned along two alignment coordinates x and y of an overall facet arrangement that is illustrated by way of example in FIG. 3. The x-coordinate of this aligned edge contour 33 thus coincides with the x-coordinate of the overall facet arrangement. Similar is true for the y-coordinate.

The facets to which this alignment applies will also be referred to below as alignment facets 25. The axes of curvature x', y' of the toric reflection surfaces of the alignment facets 25 are in each case tilted with respect to the alignment coordinates x, y of the overall facet arrangement by a finite axis tilt angle.

Figure 6:
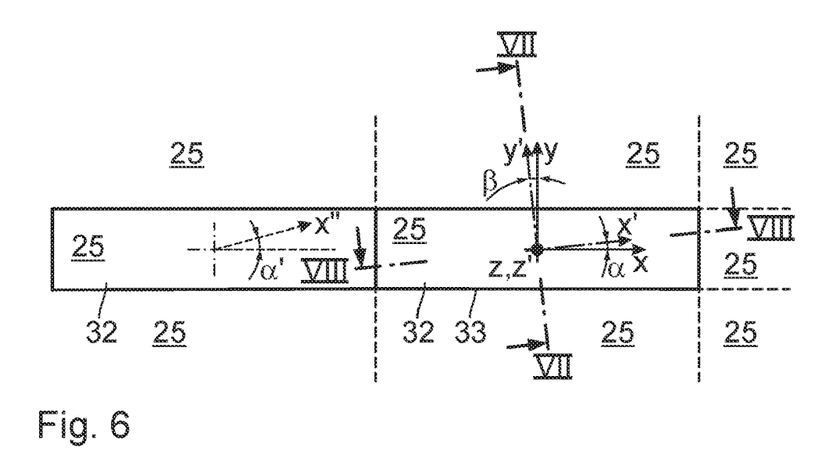
FIG. 6 shows a plan view of two adjacent field facets within a field facet arrangement in accordance with FIG. 3.

The axis of curvature x' is here tilted relative to the alignment coordinate x about the alignment coordinate z by an axis tilt angle α. The axis of curvature y' is in turn tilted relative to the alignment coordinate y about the alignment coordinate z by the axis tilt angle β. Since the coordinates of the axes of curvature x', y' and the alignment coordinates xyz are Cartesian coordinates, the two angles α and β are in this case the same size.

Figure 7:
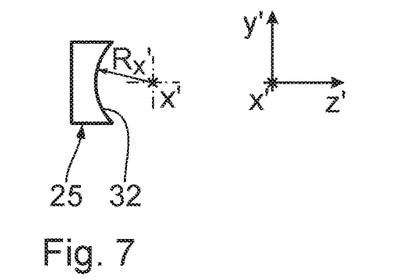
FIG. 7 shows a section through one of the two field facets in accordance with FIG. 6 along the line VII-VII in FIG. 6.

The axis of curvature x' defines a curvature of the toric reflection surface 32 of the field facet 25 in the y'z'-plane (cf. FIG. 7). A radius of curvature of the reflection surface 32 in this y'z'-plane is designated $R_x'$.

Figure 8:
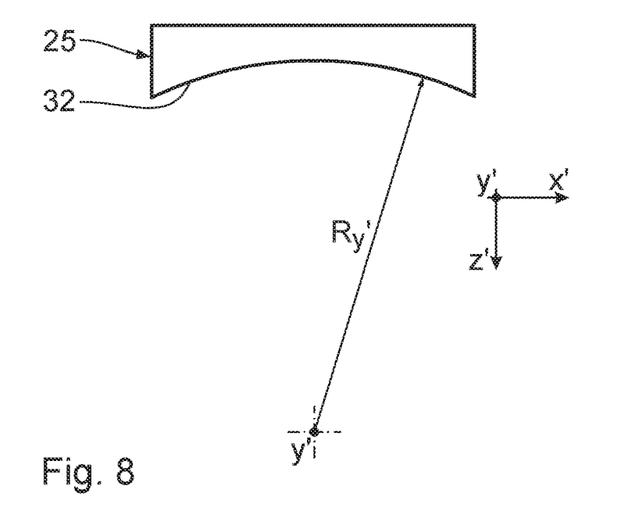
FIG. 8 shows a section through the field facet along the line VIII-VIII in FIG. 6.

Accordingly, the axis of curvature y' defines a curvature of the reflection surface 32 in the x'z'-plane. A radius of curvature of the reflection surface 32 in the x'z'-plane is designated $R_y'$.

FIGS. 6 and 7 show the radii of curvature $R_x'$, $R_y'$ in a highly schematic fashion. Other curvature conditions are also possible. Both $R_x'$ and $R_y'$ lie in the range between 200 mm and 2000 mm, for example in the range between 500 mm and 1500 mm, in the range between 800 mm and 1200 mm and in particular in the range of 1000 mm. The following always applies: $R_x' \neq R_y'$. An eccentricity $\Delta R = R_x' - R_y'$ lies in the range between 10 mm and 200 mm, for example in the range between 15 mm and 100 mm, between 20 mm and 60 mm and in particular in the range around 40 mm. For $\Delta R/R_y'$, a percent range between 0.5% and 10%, in particular between 1% and 8%, between 2% and 6%, for example in the range around 4%, applies.

It is also true that the smaller of the two radii of curvature $R_x'$, $R_y'$ of the toric reflection surface 32 is finite. The other of the two radii of curvature $R_y'$, $R_x'$ can be infinite, which results in a cylindrical reflection surface 32, or can be finite, which results in a toric reflection surface 32 having a reflection surface that is curved via two axes of curvature.

A cylindrical surface or cylinder surface represents a special case of a toric surface and is likewise a toric surface within the meaning of this application.

An effect of a toric reflection surface design of the alignment field facets 25 will be explained below with reference to FIGS. 9 and 10.

Figure 9:
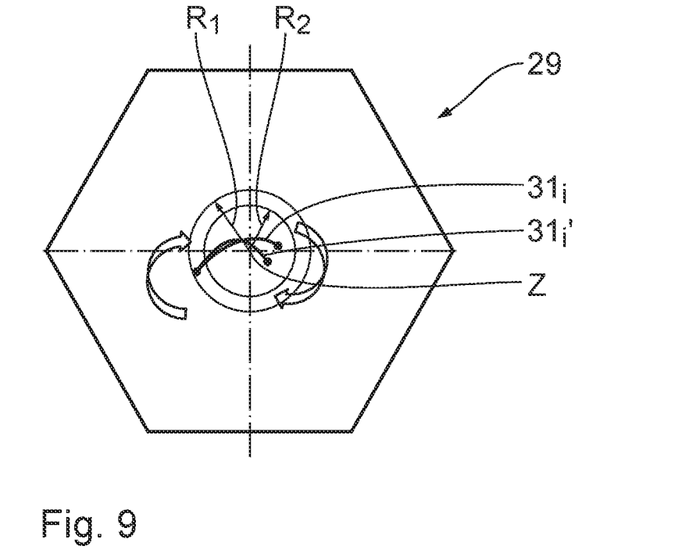
FIG. 9 shows an illustration that is similar to FIG. 5 of a further variant of a pupil facet, wherein the field-dependent centroid profile of the illumination-light subbeams, which originate from different points on the field facet, during the imaging of the light source is shown for an illumination channel which is guided over the same pupil facet, wherein the imaging is effected on the one hand using a conventional field facet and, on the other, with a tilted field facet reflection surface that has a toric design in accordance with the disclosure.
Figure 10:
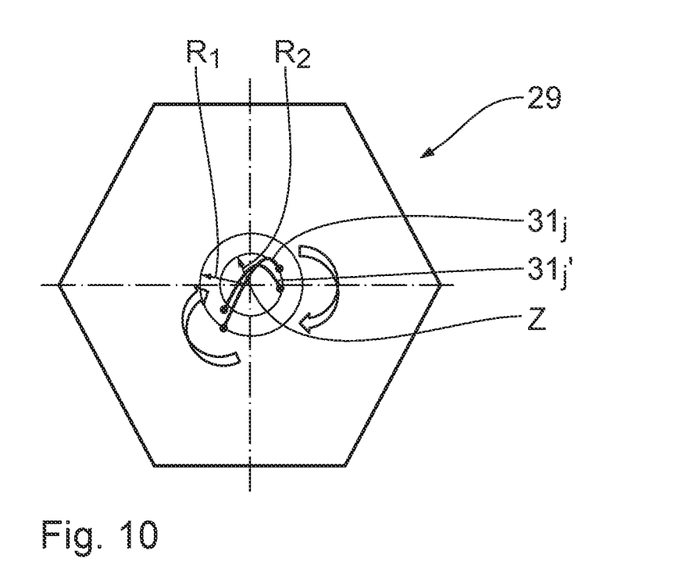
FIG. 10 shows, in an illustration that is similar to FIG. 9, the field-dependent centroid profiles of the illumination-light subbeams, which originate from different points on the field facet, for an illumination channel that is guided over a further pupil facet, wherein the imaging is again effected on the one hand with a conventional field facet and, on the other, with a tilted field facet reflection surface that has a toric design in accordance with the disclosure.

FIGS. 9 and 10 show a further variant of a pupil facet 29, which is configured as a pupil facet having a hexagonal edge.

FIG. 9 shows, on the reflection surface of the illustrated pupil facet 29, the field-dependent centroid profile $31_i$, $31_i'$ of the light source imaging for an illumination channel $16_i$. These two field-dependent centroid profiles $31_i$, $31_i'$ are present on the same pupil facet 29 and come about due to the imaging effect firstly of a conventional, non-tilted alignment field facet 25 (centroid profile $31_i$) and secondly due to an alignment field facet 25 (centroid profile 31$_i$') that is tilted in accordance with the disclosure. These two centroid profiles 31$_i$, 31$_i$' are shown in FIG. 9 as a schematic overlay, which comes about due to the effect both of the conventional alignment field facet 25 and the alignment field facet 25 that is tilted in accordance with the disclosure.

On the basis of the imaging by way of the conventional alignment field facet 25, a centroid profile 31$_i$ with a maximum distance R$_i$ from a center Z of the reflection surface of the pupil facet mirror 29 is obtained. This distance value R$_i$ is described in FIG. 9 as the radius of a circumcircle around the center Z, into which the centroid profile 31$_i$ is inscribed. The imaging effect of the tilted alignment field facet 25 results in a field-dependent centroid profile 31$_i$', which is tilted about the center Z of the pupil facet 29 and compressed at the same time. On the basis of the changed effect of the alignment field facet 25 which arises from the tilting, the centroid profile 31$_i$' with a smaller maximum distance R$_2$ from the center Z of the reflection surface of the pupil facet mirror 29 is obtained. The above-mentioned compression of the centroid profile 31$_i$' as compared to the conventional centroid profile 31$_i$ has the effect that the maximum distance R$_2$ of the field-dependent centroid profile 31$_i$' is reduced by approximately 25% as compared to the distance R$_1$. As a result, firstly R$_2$<R$_1$, and secondly approximately: R$_2$=0.75R$_1$.

FIG. 10 shows field-dependent centroid profiles 31$_j$, 31$_j$' of an illumination-light beam of a further illumination channel 16$_j$ when imaging firstly by way of a conventional and tilted field facet 25 and secondly by way of an alignment field facet 25 having a toric reflection surface 32 that is tilted about the axis tilt angles α, β. The results are field-dependent centroid profiles 31$_j$'. The centroid profile associated with the conventional field facet 25 is designated 31$_j$. The centroid profile 31$_j$' associated with the tilted alignment facet 25 is likewise tilted about the center Z of the associated pupil facet 29 and compressed at the same time.

The effect of the compression even in the case of the illumination channel 16$_j$ in accordance with FIG. 10 is that a maximum distance R$_2$ of the field-dependent centroid profile 31$_j$' from the center Z of the associated pupil facet 29 is reduced as compared to the distance R$_1$. Again, R$_2$<R$_1$. Once again, approximately: R$_2$=0.75R$_1$.

The tilt angles α, β in the centroid profiles illustrated in FIGS. 9 and 10 are in each case 6 degrees.

In particular the compression of the centroid profiles 31$_i$', 31$_j$', as compared to the illumination-light partial beams guided using the conventional field facets, results in a constriction of the illumination-light partial beams 16$_i$, 16$_j$ on the pupil facets 29, with the result that complete reflection of the partial beams 16$_i$, 16$_j$ at the associated pupil facets 29 is facilitated without undesired light losses. Drifts of the partial beams 16$_i$, 16$_j$ on the pupil facets 29 can be more easily tolerated. The compression of the centroid profiles 31$_i$, 31$_j$' additionally has the result that a possible cutting-off behavior of illumination-light subbeams 16$_i$" becomes less field-dependent and such a dependence is reduced also at the field edge and in particular beyond the field edges at the site of the arrangement of possible energy or dose sensors. Subsequent adjustment of the light source 2 as a reaction to measured intensity changes is thus simplified.

When designing the field facet mirror 19 with the alignment facets, the tilt angles α, β of all alignment facets 25 are identical.

In an alternative configuration, which is illustrated schematically in FIG. 6, the alignment tilt angles α (and β) on the one hand and α' (and correspondingly β') on the other hand differ from one another. In the configuration in accordance with FIG. 6, α', that is to say the angle between the guide axis x" of the field facet 25 that is on the left in FIG. 6 and the alignment coordinate x, is greater than the angle α between the axis of curvature x' of the field facet 25 that is on the right in FIG. 6 and the alignment coordinate x.

In the projection exposure using the projection exposure apparatus 1, at least part of the reticle 7 in the object field 5 is imaged onto a region of the light-sensitive layer on the wafer 13 in the image field 11 for lithographically producing a microstructured or nanostructured component, in particular a semiconductor component, for example a microchip. Here, the reticle 7 and the wafer 13 are continuously moved in the y-direction in time-synchronized fashion during the scanning operation.

What is claimed is:

1. A facet mirror, comprising:
    a plurality of facets configured to reflect EUV illumination light,
    wherein:
        at least some of the facets comprise alignment facets;
        the alignment facets comprise a reflection surface with an edge contour aligned along two alignment coordinates of an overall facet arrangement;
        the reflection surface of at least one of the alignment facets comprises a surface shape that exhibits different curvatures along two axes of curvature;
        the two axes of curvature are tilted about a finite axis tilt angle with respect to the alignment coordinates of the overall facet arrangement; and
        each of the alignment facets has a contiguous reflection surface.

2. The facet mirror of claim 1, wherein:
    the alignment facets comprise first and second alignment facets;
    the reflection surface of first and second alignment facets comprise surface shapes exhibiting different curvatures along two axes of curvature; and
    the axis tilt angles of the first and second alignment facets differ.

3. The facet mirror of claim 1, wherein the finite axis tilt angle is at least one degree.

4. The facet mirror of claim 1, wherein a greater radius of curvature of the reflection surface is infinite.

5. The facet mirror of claim 1, wherein both radii of curvature of the reflection surface are finite.

6. The facet mirror of claim 1, wherein:
    the alignment facets comprise first and second alignment facets;
    the reflection surface of first and second alignment facets comprise surface shapes exhibiting different curvatures along two axes of curvature;
    the axis tilt angles of the first and second alignment facets differ; and
    the finite axis tilt angle is at least one degree.

7. The facet mirror of claim 6, wherein a greater radius of curvature of the reflection surface is infinite.

8. The facet mirror of claim 6, wherein both radii of curvature of the reflection surface are finite.

9. The facet mirror of claim 1, wherein:
    the alignment facets comprise first and second alignment facets;
    the reflection surface of first and second alignment facets comprise surface shapes exhibiting different curvatures along two axes of curvature;
    the axis tilt angles of the first and second alignment facets differ; and a greater radius of curvature of the reflection surface is infinite.

10. The facet mirror of claim 9, wherein both radii of curvature of the reflection surface are finite.

11. The facet mirror of claim 1, wherein:
the alignment facets comprise first and second alignment facets;
the reflection surface of first and second alignment facets comprise surface shapes exhibiting different curvatures along two axes of curvature;
the axis tilt angles of the first and second alignment facets differ; and
both radii of curvature of the reflection surface are finite.

12. The facet mirror of claim 1, wherein a difference between the radii of curvature is between 20 mm and 60 mm.

13. The facet mirror of claim 1, wherein the radii of curvature are between 200 mm and 2000 mm.

14. An illumination optical unit, comprising:
a facet mirror according to claim 1,
wherein the illumination optical unit is configured to illuminate an object field with illumination light.

15. An illumination system, comprising:
a light source; and
an illumination optical unit comprising a facet mirror according to claim 1,
wherein the illumination optical unit is configured to illuminate an object field with illumination light generated by the light source.

16. An optical system, comprising:
an illumination optical unit comprising a facet mirror according to claim 1; and
a projection optical unit,
wherein the illumination optical unit is configured to illuminate an object field with illumination light, and the projection optical unit is configured to image the object field into an image field.

17. An apparatus, comprising:
a light source;
an illumination optical unit comprising a facet mirror according to claim 1; and
a projection optical unit,
wherein the illumination optical unit is configured to illuminate an object field with illumination light generated by the light source, the projection optical unit is configured to image the object field into an image field, and apparatus is a projection exposure apparatus.

18. The apparatus of claim 17, further comprising:
an object holder comprising an object displacement drive configured to displace an object in the object field along an object displacement direction; and
a wafer holder comprising a wafer displacement drive configured to displace a wafer in synchronization with the object displacement drive.

19. A method of using a projection exposure apparatus comprising an illumination optical unit and a projection optical unit, the method comprising:
using the illumination optical unit to illuminate a lithography mask; and
using the projection optical unit to project at least a portion of the illuminated lithography mask onto a light-sensitive material,
wherein the illumination optical unit comprises a facet mirror according to claim 1.

20. A method of aligning a facet of a facet mirror, the facet mirror comprising a plurality of facets configured to reflect EUV illumination light, at least some of the facets being alignment facets which comprise a reflection surface with an edge contour aligned along two alignment coordinates of an overall facet arrangement, the reflection surface of a first alignment facet having a surface shape that exhibits different curvatures along two axes of curvature, the method comprising:
aligning the two axes of curvature of the reflection surface of the first alignment facets by tilting the two axes of curvature about a finite axis tilt angle with respect to the alignment coordinates of the overall facet arrangement.

* * * * *